United States Patent [19]

Chiang

[11] Patent Number: 5,091,661
[45] Date of Patent: Feb. 25, 1992

[54] METHODS AND APPARATUS FOR REDUCING COUPLING NOISE IN PROGRAMMABLE LOGIC DEVICES

[75] Inventor: David Chiang, Saratoga, Calif.
[73] Assignee: Altera Corporation, San Jose, Calif.
[21] Appl. No.: 587,075
[22] Filed: Sep. 24, 1990
[51] Int. Cl.⁵ .......................................... H03R 19/177
[52] U.S. Cl. ................................ 307/465; 307/443; 307/468
[58] Field of Search ............... 307/443, 451, 465, 468, 307/469

[56] References Cited

U.S. PATENT DOCUMENTS

| | | | |
|---|---|---|---|
| 4,587,445 | 5/1986 | Kanuma | 307/443 |
| 4,656,370 | 4/1987 | Kanuma | 307/443 X |
| 4,761,572 | 8/1988 | Tanizawa | 307/443 X |
| 4,774,421 | 9/1988 | Hartmann et al. | 307/468 X |
| 4,857,765 | 8/1989 | Cahill et al. | 307/443 |
| 4,912,342 | 3/1990 | Wong et al. | 307/465 |
| 4,965,474 | 10/1990 | Childers et al. | 307/465 X |

Primary Examiner—David Hudspeth
Attorney, Agent, or Firm—Robert R. Jackson

[57] ABSTRACT

Methods and apparatus are provided for reducing the possibility of erroneous operation in integrated circuit structures such as Programmable Interconnector arrays (PIAs) in high-density Programmable Logic Devices (PLDs) due to unintentional transmission of coherent switching transients from word lines to bit lines. The logical states of appropriate PIA word lines are inverted in a way that reduces the possibility of coherent switching of multiple word lines in the word lines and bit line swithcing matrix. This technique requires little or no area overhead and is completely transparent to the user. It changes the perforamnce of the PLDs so that situations in which worst-case conditions apply become highly unlikely, whereas these same worst-case conditions are very likely to arise in prior PLDs.

13 Claims, 4 Drawing Sheets

FIG.4a
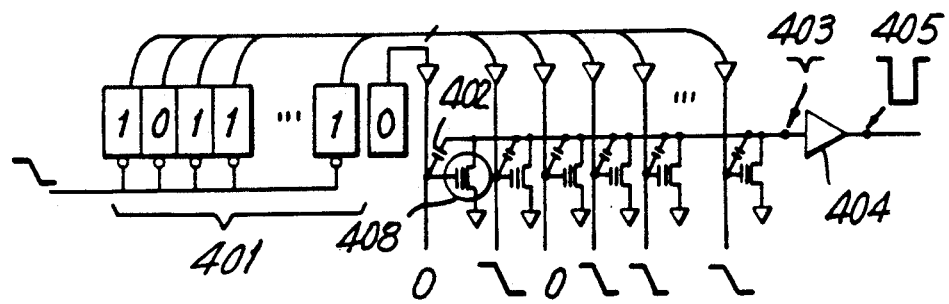
FIG.4b
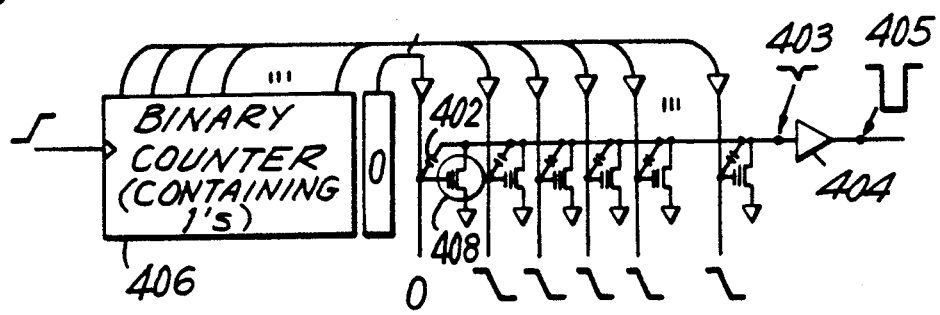
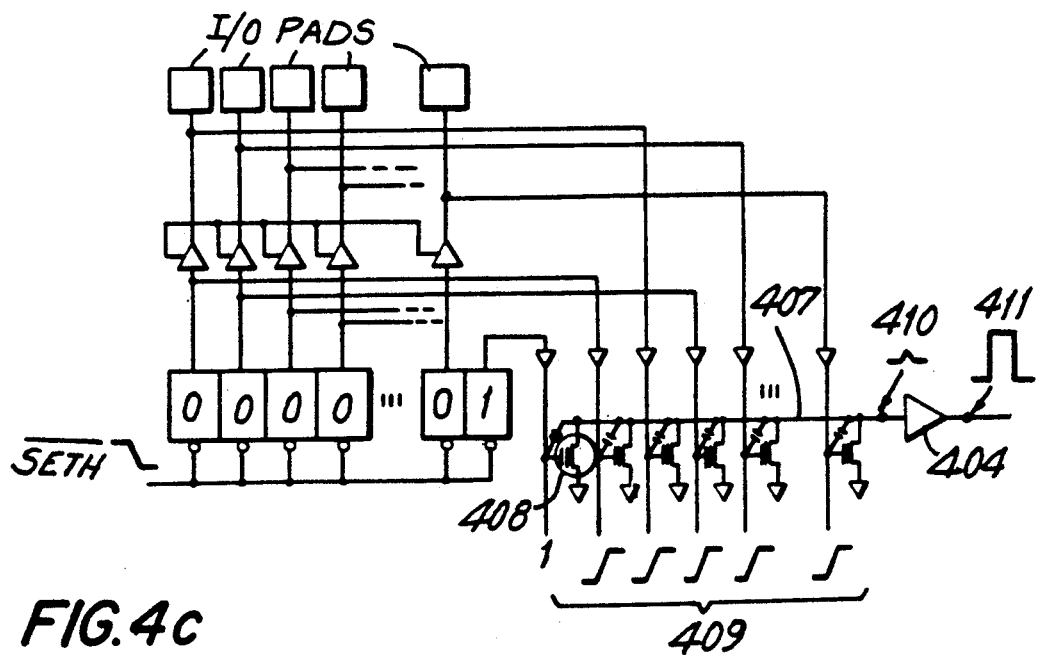
FIG.4c

METHODS AND APPARATUS FOR REDUCING COUPLING NOISE IN PROGRAMMABLE LOGIC DEVICES

BACKGROUND OF THE INVENTION

This invention relates to supplying the signals to a large group of conductors in close proximity to another group of conductors in such a way that coupling noise between the groups is reduced. For example, this invention can be employed in supplying signals to the word lines of a Programmable Interconnect Array (PIA) in a high-density Programmable Logic Device (PLD) so as to reduce the noise coupled to the PIA bit lines by the signals on the word lines.

Wong et al. U.S. Pat. No. 4,871,930 is background to this invention and is hereby incorporated by reference herein.

A high-density PLD may include a PIA which generally comprises one or more Electrically Programmable Read-Only Memory (EPROM) arrays in which a large number of word lines drive bit lines via selectively programmed floating-gate transistors. Typically, all of the word lines cross the bit lines so that appropriate interconnections can be made. This causes parasitic capacitance to be present between the word lines and the bit lines. The PIA bit lines are therefore susceptible to coupling noise generated when large numbers of PIA word lines are switched coherently (i.e., simultaneously in the same direction). For example, when a global clear signal activates, or when large binary counters roll over, many macrocell outputs change simultaneously. As this happens, the states of a large number of word lines change simultaneously from logical one to logical zero or vice versa, thus generating a large transient electromagnetic field which is coupled to the bit lines. Furthermore, in high-density PLDs with dual feedback, the coupling noise is increased because when a set of N output macrocells switch coherently, 2N PIA word lines switch coherently. This is a consequence of the architecture of a conventional high-density PLD with dual feedback in which the output macrocell and its associated input/output (I/O) pad input both feed word lines in the PIA.

In view of the foregoing, it is an object of this invention to provide an improved technique for supplying signals to structures such as the PIA in high-density PLDs which reduces the noise coupled to the bit lines when large numbers of word lines switch coherently.

It is a further object of this invention to provide an improved technique for supplying signals to structures such as the PIA in high-density PLDs with dual feedback, which technique reduces the noise coupled to the bit lines when large numbers of word lines switch coherently.

SUMMARY OF THE INVENTION

These and other objects of the invention are accomplished in accordance with the principles of the invention by inverting the logical states of selected word lines of a structure such as a PIA in such a way that, when large numbers of word lines switch coherently, the noise coupled to the associated bit lines is reduced by destructive interference. However, to accomplish this goal in high-density PLDs requires 1 the careful use of architectural features of the devices.

Further features of the invention, its nature and various advantages will be more apparent from the accompanying drawings and the following detailed description of the preferred embodiments.

BRIEF DESCRIPTION OF THE DRAWINGS

FIGS. 4a, 4b, and 4c (sometimes referred to collectively as FIG. 4) are schematic block diagrams of part of a conventional PLD, showing conditions under which noise coupling can cause erroneous signals in the PLD.

DETAILED DESCRIPTION OF THE PREFERRED EMBODIMENTS

Figure 1:
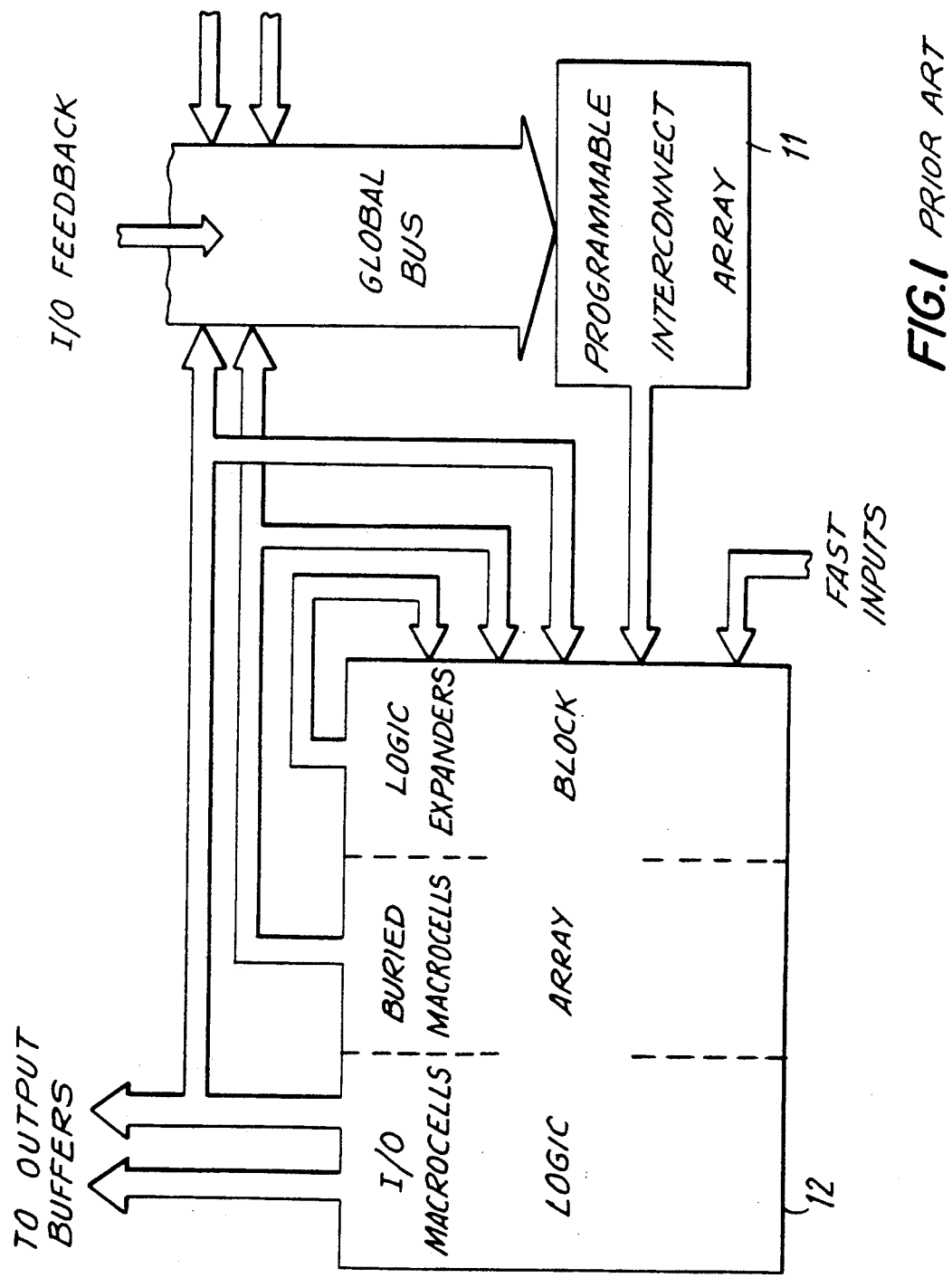
FIG. 1 is a block diagram of a portion of a conventional high-density PLD.

FIG. 1 shows the architecture of a conventional high-density PLD such as the EPM5128 available from Altera Corporation of San Jose, CA. Block 11 is the Programmable Interconnect Array (PIA) in connection with which this invention can be employed.

Figure 2:
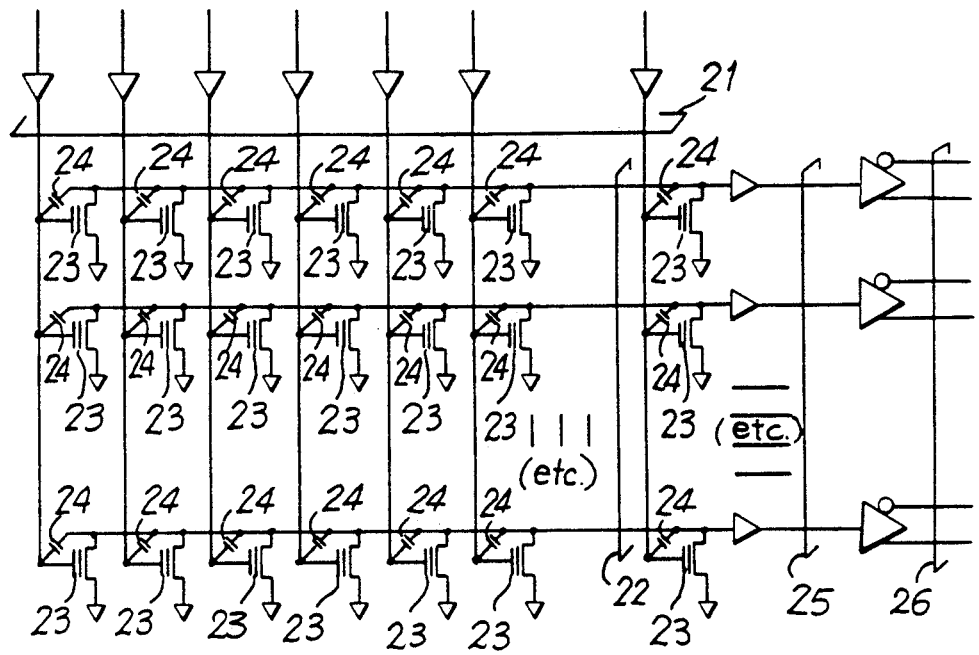
FIG. 2 is a schematic diagram of part of a possible conventional PIA showing the parasitic capacitances which couple noise from the word lines to the bit lines.

FIG. 2 shows a possible circuit implementation of a conventional PIA. The PIA generally comprises an EPROM array with a large number of word lines 21 which are driven by outputs from macrocells and inputs from I/O pads. The word lines drive bit lines 22 via floating-gate transistors 23 which form EPROM bits. When an EPROM bit is "programmed," the associated floating-gate transistor is switched off (i.e., no channel can be induced between the source and drain). When an EPROM bit is "erased," a channel between the source and drain can be induced by the application of a voltage (greater than the threshold voltage) to the control gate of the transistor.

In normal PIA operation, each bit line is either driven by a selected word line through only one erased EPROM bit, or it is not driven by any word line (i.e., all EPROM bits connected to the bit line are programmed). The close proximity of the word lines to the bit lines, and the EPROM bits coupling each word line to each bit line, introduce parasitic capacitances 24 through which voltage changes can be unintentionally transmitted between word lines and bit lines.

The bit line voltages can easily be inadvertently disturbed by coherent switching of the word lines because the bit lines are held relatively weakly in a logical one state by a passive pull-up device, or relatively weakly in a logical zero state by a single EPROM. The parasitic capacitive coupling between the PIA word lines and the bit lines can result in these inadvertent disturbances being passed on as glitches to the Logic Array Block (LAB) 12 word lines 26 during coherent PIA word line switching. These glitches can cause increased delay in the sense amplifier or functional failure in the LAB logic. The coherent word line switching which gives rise to such glitches is fairly common in conventional PLDs, as will be described in the discussion of FIG. 4.

The possibility of coherent switching can, however, be reduced by inverting the logical sense of some of the word lines. The PIA word lines, which form the input signals to the PIA, are single polarity where, for the purposes of this invention, a signal is termed "single polarity" if its logical complement is not present in the logical block under consideration. However, the PIA bit lines, which form the output signals 25 from the PIA, drive complementary word lines 26 in LAB 12. The PIA functions as a programmable switching matrix in which a selected PIA word line drives a complementary LAB word line pair. This is accomplished by programming all EPROMs on the corresponding PIA bit line except for the single EPROM corresponding to the selected PIA word line. The important point here is that both polarities of the selected PIA word line are available in the LAB regardless of the sense of the PIA word line. Thus, inverting the logical state of the PIA word lines will only affect the order in which the LAB word lines occur, but will not affect the logic of the circuit. This fact will be utilized implicitly by the invention.

Figure 3:
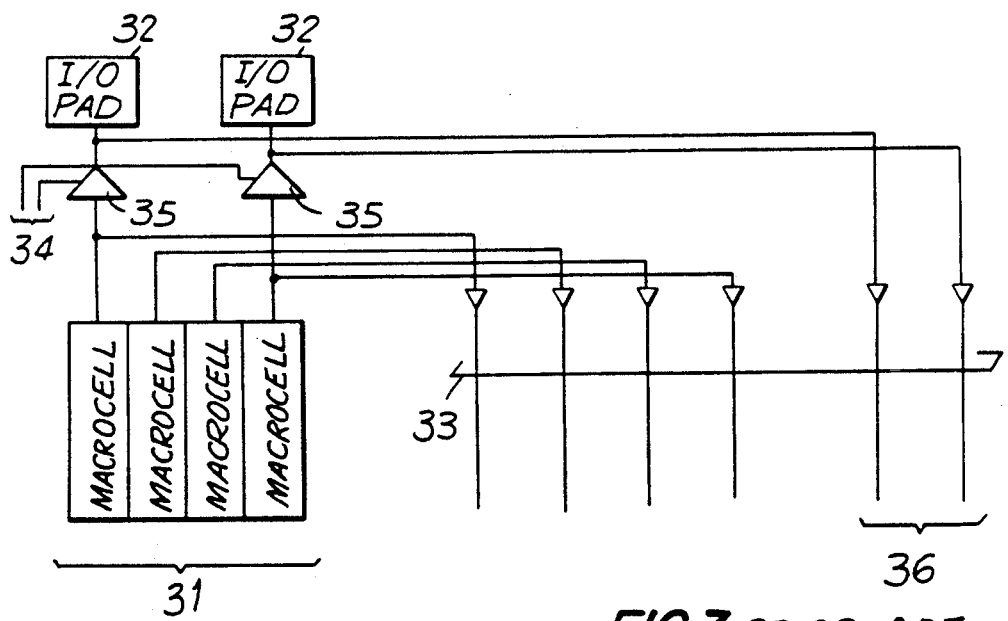
FIG. 3 is a block diagram showing the connections between macrocells and I/O pads in a conventional PLD.

FIG. 3 shows the macrocell 31 and I/O pin 32 connections of a conventional PIA. The FIG. shows PIA word lines 33 driven by outputs of macrocells 31, or by inputs from I/O pads 32. The tri-state controls 34 determine whether the I/O pads function as inputs or outputs. When the I/O pads 32 are configured as outputs, the tri-state buffers 35 pass the outputs of macrocells 31 to the I/O pads, as well as to PIA word lines 36. When the I/O pads 32 are configured as inputs, the tri-state buffers 35 isolate the I/O pads 32 from the macrocells 31. Input data is then passed from the I/O pads 32 to the PIA word lines 36.

Coherent switching of the PIA word lines is relatively easy to obtain, and the basic patterns which lead to it can be found in many typical user designs. FIG. 4 shows various situations under which such coherent switching can occur and lead to incorrect operation of the PIA.

Coherent switching can occur, as in FIG. 4a, with the global clearing of a large number of registers 401 containing logical ones. In this case, the parasitic capacitive coupling 402 from the word lines to the bit lines causes a voltage spike 403 to appear on a bit line with all EPROM bits programmed. Spikes of this form on such bit lines are possible because the bit lines are held high by a weak passive pull-up device. The sense amplifier 404 amplifies this spike and produces a "glitch" 405.

Coherent switching can also occur, as in FIG. 4b, when the macrocells form parts of a large binary counter 406. As the counter is incremented, it eventually reaches a stage where a large number of the outputs are logical ones. For example, in a twelve-bit counter, the current count may be 011111111111. The occurrence of the next clock pulse causes the counter to increment its count to 100000000000. Again, the effect is for many word lines to switch coherently from logical one states to logical zero states. This phenomenon can also lead to glitches at the outputs of sense amplifiers.

FIGS. 4a and 4b showed situations where negative-glitches can occur. However, positive glitches are also possible. FIG. 4c shows a possible situation in which positive glitches can occur on the output of the sense amplifier 404. In this case, the high on the control gate of the single erased cell 408 should ensure that bit line 407 remains low. Bit line 407 should not be affected by the high to low transition of SETH which causes all registers containing ones to switch to zeros, and causes a large number of lines 409 to go high simultaneously. However, the large number of lines 409 going high simultaneously causes a spike 410 on the bit line which is amplified by the sense amplifier 404 to produce the positive glitch 411.

A possible worst case scenario exists when a global clear signal activates and the following conditions hold: all macrocells are configured as registers; all registers contain logical ones; all macrocells are fed by a common clear signal; and all I/O pins are configured as outputs. In this case, a single common clear signal will cause all PIA word lines to switch coherently from logical one to logical zero.

Figure 5:
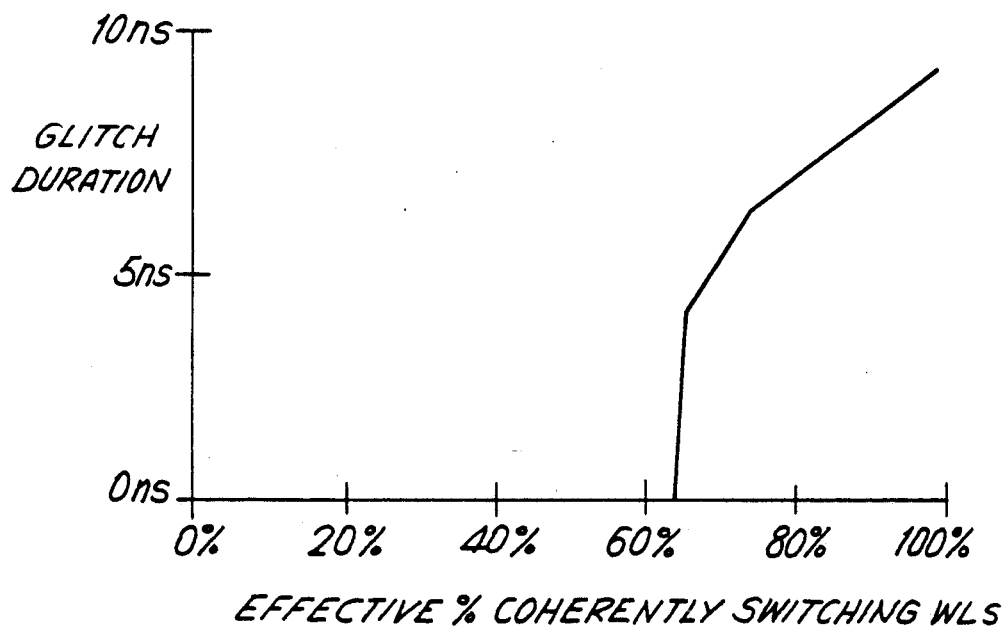
FIG. 5 is a graph showing the relationship between the effective percentage of word lines switching coherently, and the duration of erroneous output signals or "glitches."

FIG. 5 shows a plot of the glitch duration at the output of the PIA sense amplifier as a function of the effective number of coherently switching PIA word lines. Here, it is assumed that word lines are either switching coherently or not switching. With few word lines switching coherently, the amplitude of the spike at the input of the sense amplifier may not be of sufficient magnitude to trigger that device. Only after a certain minimum number of word lines switch coherently will the output of the sense amplifier be affected. The critical number of word lines that need to switch coherently before a glitch occurs at the output of the sense amplifier is typically greater than 65%. This number depends on the PIA circuit and its characteristics, and the transistor characteristics of a particular process lot. In a typical architecture, about 30% of the PIA word lines are connected to I/O pads. Therefore, if all I/O pads are configured as outputs, the output macrocells driving I/O pins make up about 60% of PIA word lines, either as direct macrocell outputs or as I/O pad outputs. Thus, if only an additional 5% of the word lines switch coherently with the macrocells, a glitch will be obtained.

Figure 6:
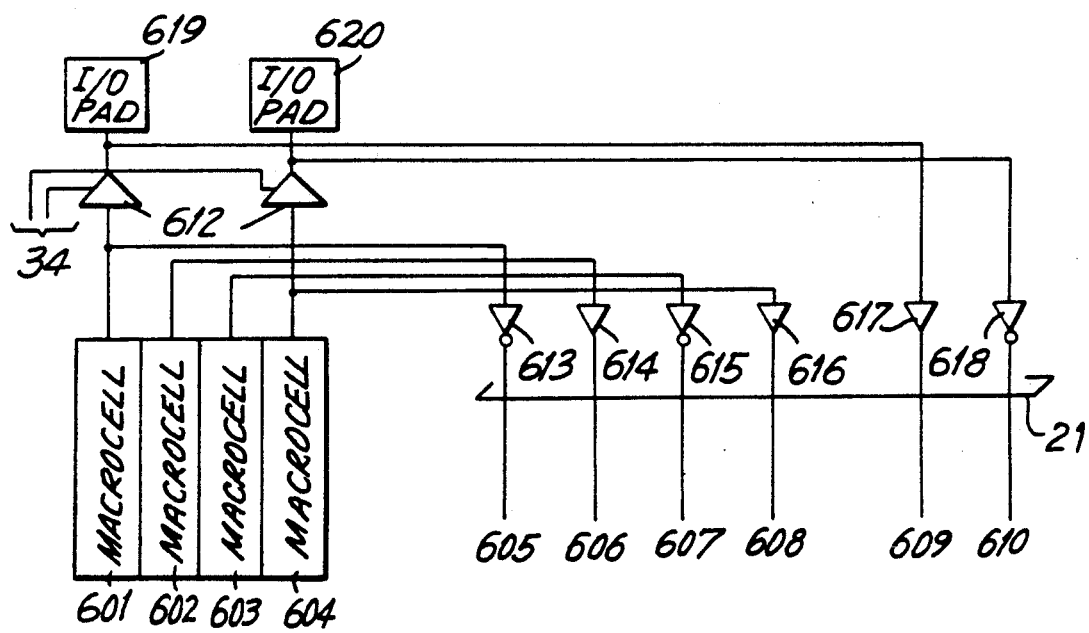
FIG. 6 is a block diagram of an illustrative embodiment of the invention.

FIG. 6 shows an illustrative embodiment of the invention designed to reduce the likelihood of coherent switching of word lines. There are two aspects to this invention. The first aspect involves making the PIA output macrocell word lines (e.g., word line 608) and any associated I/O pad word lines (e.g., word line 610) to be of opposite logical sense by the introduction of invertor 618 in place of a buffer in one of these word lines. With this configuration, when an output macrocell (e.g., 604) driving an I/O pad 620 switches, the two corresponding PIA word lines (608 and 610) switch in a complementary fashion, hence tending to cancel each other's effects on the bit lines.

With the scheme as described, if more than about two thirds of the I/O pads are configured as outputs at all times, then more than 20% of the PIA word lines will be connected to I/O pads. Thus, due to feedback to the PIA word lines via the tri-state buffers 611, more than 40% of the PIA word lines will, by design, mutually cancel their self-generated switching noise. Thus, it is not possible for effectively more than 60% of the word lines to switch coherently, and the critical 65% necessary for glitch generation is unattainable.

In the second aspect of the invention, to further decrease the possibility of coherent switching of PIA word lines, word lines from macrocell outputs (including buried and output macrocells) are alternately made to be complementary to their macrocell values by the introduction of invertors (e.g., 613 and 615). For example, word line 606 has the same logical value as its corresponding buried macrocell 602, while word line 607 has a logical value which is complementary to that of its corresponding buried macrocell 603. Similar statements are true regarding word lines 605 and 608, and their corresponding output macrocells 601 and 604. The order of the macrocells whose outputs are to be inverted is not particularly important, although the "natural order" in which circuit design software utilizes the macrocells would be preferred.

Whereas the conditions under which large numbers of word lines switch coherently were easily obtainable with prior PIA word line drive circuits, they are difficult to obtain with word line drive circuits in accordance with this invention. As explained above, worst case conditions were obtained in prior PIAs when all macrocell outputs switched from all ones to all zeros, or vice versa. These conditions are fairly common. In this invention, the logical inversion of selected word lines changes the easily obtained worst-case conditions into rarely obtained conditions.

The particular situation under which the worst-case scenario can occur in the invention requires the following conditions to be satisfied: all I/Os are configured as inputs; all macrocells are configured as registers; and all registers and I/O pads must be toggled simultaneously with a specific transition pattern that depends on the internal inversion pattern. These conditions are unlikely to occur in practice. Furthermore, if knowledge regarding intended use of the device is available, it is possible to design the internal inversion pattern so that the possibility of coherent switching of large numbers of word lines is eliminated.

In summary, the two aspects of the invention are:
1) The PIA word lines from output macrocells and their corresponding I/O pad inputs are alternately configured to be logical complements of each other. Thus, when such an output macrocell switches, the two corresponding PIA word lines switch in opposite directions.
2) Alternate PIA word lines are made to be logical complements of their corresponding macrocell outputs. Thus, if all macrocell outputs switch coherently, half of the word lines will switch from one to zero, and the other half will switch from zero to one.

The above two design features tend to cancel the electromagnetic transients that are coupled from the word lines to the bit lines.

It will be understood that the foregoing is merely illustrative of the principles of this invention, and that various modifications can be made by those skilled in the art without departing from the scope and spirit of the invention. For example, although invertor 618 is shown connected between I/O pad 620 and PIA word line 610, with other suitable modifications, it could equally well have been positioned between macrocell 604 and tri-state buffer 612.

I claim:

1. A programmable logic device comprising:
    a plurality of input conductors, each of which crosses a plurality of output conductors so that a signal applied to any one of said input conductors can be communicated unintentionally to any one of said output conductors by parasitic transmission media;
    a plurality of sources for generating a set of logical input signals, said set of logical input signals being classified into a group of logical input signals to be inverted and a group of remaining logical input signals;
    means for providing the logical states of said output conductors and the complement of the logical states of said output conductors for subsequent processing in said programmable logical device;
    means for inverting the logical state of said group of logical input signals to be inverted to produce a group of inverted logical input signals; and
    means for applying said group of inverted logical input signals and said group of remaining logical input signals to said input conductors so that, when some or all of said logical input signals change simultaneously to the same state, the effect of said logical input signals communicated unintentionally to said output conductors is reduced.

2. The apparatus defined in claim 1 wherein a signal on any one of said input conductors can be communicated intentionally to any one of said output conductors by a switching device.

3. The apparatus defined in claim 2 wherein said switching device comprises a floating-gate transistor.

4. The apparatus defined in claim 1 wherein said sources for generating said logical input signals comprise macrocells.

5. The apparatus defined in claim 4 wherein said sources for generating logical input signals further comprise input/output pads, and wherein at least some of said macrocells are connectable to said input/output pads by tri-state buffers.

6. The apparatus defined in claim 1 wherein said sources for generating said logical input signals comprise input/output pads.

7. The apparatus defined in claim 1 wherein said input conductors comprise word lines.

8. The apparatus defined in claim 1 wherein said output conductors comprise bit lines.

9. The apparatus defined in claim 1 wherein said group of inverted logical input signals and said group of remaining logical input signals comprise substantially the same number of signals.

10. The apparatus defined in claim 1 wherein said means for applying said group of inverted logical input signals and said group of remaining logical input signals to said input conductors is constructed on the basis of knowledge of the intended use of the electrically programmable logic device so that in said intended use, not more than a predetermined number of signals on said input conductors can change to the same state simultaneously.

11. The apparatus defined in claim 1 wherein said means for inverting the logical state of said group of logical input signals to be inverted is included in said means for applying said group of inverted logical input signals to said input conductors.

12. The method for applying a plurality of logical input signals to a plurality of input conductors which cross a plurality of output conductors in a programmable logic device wherein said logical input signals can be communicated intentionally from said input conductors to said output conductors by a plurality of switching devices and unintentionally by parasitic transmission media, said method comprising the steps of:
    providing the logical state of said output conductors and the complement of the logical state of said output conductors for subsequent processing in said programmable logic device; and
    inverting the logical states of some, but not all, of said logical input signals prior to crossing said output conductors so that unintentional communication by said parasitic transmission media of simultaneous switching of said logical input signals to said output conductors is reduced.

13. A programmable logic device circuit comprising:
a plurality of word lines, each of which crosses a plurality of bit lines so that a signal applied to any one of said word lines can be communicated both intentionally to any one of said bit lines by a floating-gate transistor, and unintentionally by parasitic capacitance;
a plurality of sources for generating a set of logical input signals, said plurality of sources comprising macrocell outputs and input/output pads, and said set of logical input signals being classified into a group of logical input signals to be inverted and a group of remaining logical input signals;
a plurality of combined inverting and non-inverting buffers for providing the logical states of said output conductors and the complement of the logical states of said output conductors for subsequent processing in said programmable logical device;
a plurality of invertors for inverting the logical state of said group of logical input signals to be inverted to produce a group of inverted logical input signals; and
a plurality of buffers for applying said group of inverted logical input signals and said group of remaining logical input signals to said word lines so that, when some or all of said logical input signals change simultaneously to the same state, the effect of said logical input signals communicated unintentionally to said bit lines is reduced.

* * * * *